United States Patent
Striebel

(10) Patent No.: US 6,953,892 B2
(45) Date of Patent: Oct. 11, 2005

(54) CONNECTION HOUSING FOR AN ELECTRONIC COMPONENT

(75) Inventor: Dirk Striebel, Oftersheim (DE)

(73) Assignee: Siemens Production and Logistics System AG, Nuremberg (DE)

( * ) Notice: Subject to any disclaimer, the term of this patent is extended or adjusted under 35 U.S.C. 154(b) by 113 days.

(21) Appl. No.: 10/475,606

(22) PCT Filed: Apr. 8, 2002

(86) PCT No.: PCT/DE02/01280

§ 371 (c)(1),
(2), (4) Date: Oct. 22, 2003

(87) PCT Pub. No.: WO02/089257

PCT Pub. Date: Nov. 7, 2002

(65) Prior Publication Data

US 2004/0132321 A1 Jul. 8, 2004

(30) Foreign Application Priority Data

Apr. 25, 2001 (DE) ......................... 101 20 256

(51) Int. Cl.⁷ ............................................. H01L 23/02
(52) U.S. Cl. ................... 174/52.4; 257/693; 257/697; 257/698
(58) Field of Search ............... 174/52.4, 52.5; 257/698, 693, 697

(56) References Cited

U.S. PATENT DOCUMENTS

| | | | | |
|---|---|---|---|---|
| 4,991,291 A | * | 2/1991 | Koepke et al. | ............... 29/884 |
| 5,064,782 A | * | 11/1991 | Nishiguchi | .................. 228/121 |
| 5,069,626 A | | 12/1991 | Patterson et al. | |
| 5,901,046 A | * | 5/1999 | Ohta et al. | .................. 361/760 |
| 6,031,284 A | | 2/2000 | Song | |
| 6,091,022 A | * | 7/2000 | Bodin | ....................... 174/52.5 |
| 6,118,072 A | * | 9/2000 | Scott | ........................ 174/52.1 |
| 6,229,088 B1 | * | 5/2001 | Launtz | .................... 174/50.51 |
| 6,713,676 B2 | * | 3/2004 | Fischer | ..................... 174/52.2 |

FOREIGN PATENT DOCUMENTS

| | | |
|---|---|---|
| EP | 645953 | 3/1995 |
| EP | 0782765 | 7/1997 |
| JP | 0509441 | 4/1993 |
| WO | WO9609646 | 3/1996 |
| WO | WO 00/03571 | 1/2000 |

* cited by examiner

*Primary Examiner*—Hung V. Ngo
(74) *Attorney, Agent, or Firm*—Harness, Dickey & Pierce, P.L.C.

(57) ABSTRACT

A connection housing includes a base body with lateral walls, which extend around the base body on top and which enclose the component to be inserted as well as inner contacts that are arranged between the component and at least one lateral wall. Polymer protuberances for forming outer contacts are shaped onto the underside. The connection between the inner contacts of the top and the outer contacts of the underside is effected by micro-boreholes that are located underneath the component in the middle area of the base body. This results in the provision of a housing, which requires little space on a printed circuit board and which can be economically produced preferably while using laser structuring.

25 Claims, 2 Drawing Sheets

CONNECTION HOUSING FOR AN ELECTRONIC COMPONENT

This application is the national phase under 35 U.S.C. §371 of PCT International Application No. PCT/DE02/01280 which has an International filing date of Apr. 8, 2002, which designated the United States of America and which claims priority on German Patent Application number DE 101 20 256.3 filed Apr. 25, 2001, the entire contents of which are hereby incorporated herein by reference.

FIELD OF THE INVENTION

The invention generally relates to a connection housing for at least one electronic component. Preferably, it relates to one including a tub-shaped base body formed from insulating material, whose top side which is surrounded by side walls has a contact surface for the component and also, at least on one side of the component between its contact surface and the edge of the base body, has internal contacts providing the electrical connection with device terminals of the component, and on its underside has protuberances formed from insulating material and at least partially coated with contact metal for forming external contacts, whereby the internal contacts are connected in each case by way of printed circuit tracks to associated external contacts.

BACKGROUND OF THE INVENTION

A connection housing formed from insulating material for electrical components, preferably integrated circuits, is known from Patent Specification U.S. Pat. No. 5,069,626 A, on whose underside a large number of peak-like protuberances which are coated with metal to serve as external contacts are arranged circumferentially in the edge zone. On the top side, a chip is arranged in the central area, whose terminals are connected by way of bond wires to printed circuit tracks which radiate out in groove-like depressions in the base body to the outer edge where they are connected by way of vertical grooves or through holes to the external contacts. This housing, which can be closed off in the upward direction by means of a cap, has very large dimensions when compared with the actual component, which are justified in situations where a component, an integrated circuit for example, needs to have a very large number of terminals for contact purposes.

From Patent Specification EP 0 782 765, an injection molded, three-dimensional substrate consisting of an electrically insulating polymer is likewise already known, over the area of whose underside are located polymer protuberances shaped during the injection molding process. This technology is referred to as PSGA (Polymer Stud Grid Array). The polymer protuberances are provided with a solderable end surface and thus form outer terminals which are connected by way of integrated printed circuit tracks to inner terminals for a semiconductor component arranged on the substrate. The polymer protuberances are used as elastic spacers to separate the module from a printed circuit board and are thus able to compensate for different expansions between printed circuit board and intermediate carrier.

The semiconductor component can either be contacted on the underside of the intermediate carrier by way of bond wires and connected by way of printed circuit tracks to the polymer protuberances shaped on the same side, or it is also possible to arrange the chip on the top side of the intermediate carrier, whereby a connection to the underside and to the polymer protuberances by way of through-contact holes comes into consideration. Micro-boreholes having a diameter of less than 200 $\mu$m (so-called vias or p-vias) which are coated with a conducting surface are provided for the through contacts. Since it is barely possible to produce micro-boreholes of such a type by using mechanical drills, the process has changed over to creating these by means of laser drilling. However, the use of injection molding means that only base bodies having a certain minimum thickness can be shaped, which has hitherto no permitted the cost-effective use of a laser for introducing the required micro-boreholes.

Furthermore, a method is known from Patent Specification EP 0 645 953 A1 for manufacturing a substrate whereby the substrate is provided with a depression in which the component is arranged in a countersunk manner in order to keep the overall thickness of the module to a minimum. The through-holes for the electrical connection between the different substrate levels are, however, located in the region where the substrate is at its full thickness, whereas beneath the component only relatively wide holes formed during the injection molding process are provided for heat dissipation purposes.

SUMMARY OF THE INVENTION

An object of an embodiment of the present invention is therefore to set down a connection housing of the type mentioned at the beginning which allows the contacts from the component by way of the inner terminals on the top side to the outer terminals on the underside to be produced in a cost-effective manner with minimum space requirements. In addition, it should be possible to securely close and seal the housing in a simple manner.

An object may be achieved according to an embodiment of the invention by the fact that the base body has micro-boreholes serving as through-contacts in the area of the contact surface for the component and that each micro-borehole on the top side is connected by way of a printed circuit track with an internal contact and is connected on the underside by way of a printed circuit track with an external contact.

As a result of the geometric configuration according to an embodiment of the invention, whereby simply the required number of internal contacts is provided on the top side beside the component and the through-contacts to the underside are relocated into the area beneath the component, the overall area of the housing can be kept to little greater than that of the component itself with the result that only a minimum amount of space is required on a printed circuit board. As a result of routing the printed circuit tracks in the inner area, these are also well protected against external influences, whereby thermal influences are also of less significance. Above all, however, conductor structures on the top side and on the underside of the base body, including the micro-boreholes, can be produced at very high speed by means of laser structuring and laser drilling, thereby enabling cost-effective production.

In a preferred embodiment of the invention, the internal contacts which in the case of components having relatively few terminals are advantageously arranged simply on one side in the edge zone, are formed by use of cams on the base body which are at least partially coated with contact metal. The printed circuit tracks to the micro-boreholes are routed by way of roof-shaped sloping side walls on these cams. As a result of these sloping side walls, printed circuit tracks of this type can also be formed in a single work process by use of laser structuring.

In a further embodiment, a depression in the area of the micro-boreholes indicates that the base body has a reduced base thickness, whereby the printed circuit tracks are each routed by way of ramp-shaped sloping side walls on the depression. By preference, the depression is provided on the underside of the base body. It can subsequently be filled with a sealing compound in order to seal the micro-boreholes. In the area of the reduced wall thickness it is not only possible to produce the micro-boreholes far more simply and cost-effectively than in the case of a base body having a normal thickness, but the contact coating to be applied can also be produced more simply and reliably on account of the reduced length of the holes.

BRIEF DESCRIPTION OF THE DRAWINGS

The present invention will become more fully understood from the detailed description of preferred embodiments given hereinbelow and the accompanying drawings, which are given by way of illustration only and thus are not limitative of the present invention, and wherein.

DETAILED DESCRIPTION OF THE PREFERRED EMBODIMENTS

Figure 1:
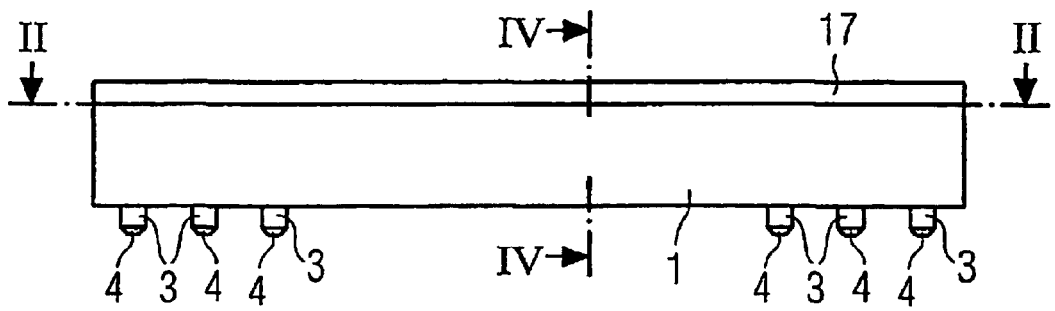
FIG. 1 shows a connection carrier implemented according to an embodiment of the invention with a cover, in which is located a component that is not visible.
Figure 2:
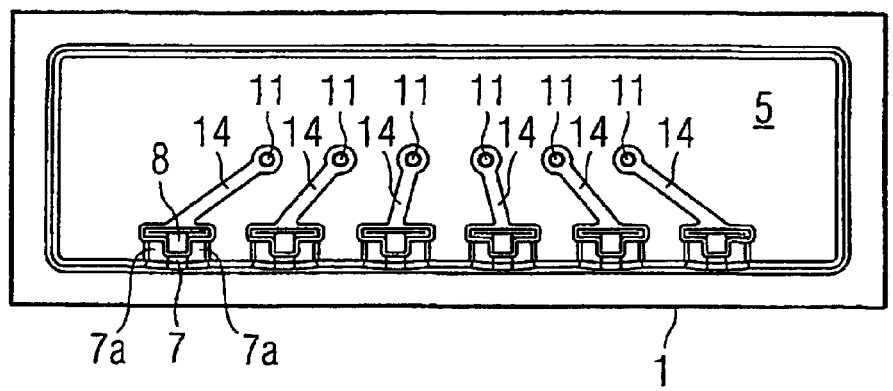
FIG. 2 shows a view from above of the connection carrier shown in FIG. 1 (without component)

The connection carrier represented in the drawing consists of a base body 1 which is injection molded three-dimensionally from a polymer plastic. In the example shown, this base body has side walls 2 running laterally with respect to the top side. On its lower side the base body is provided with protuberances 3 likewise shaped from the same material. These protuberances are provided at least on their end surfaces with terminal contacts 4 in the form of a metal coating. In addition, they are at least partially metallized along their edges in order to form printed circuit tracks which will be described below.

Figure 4:
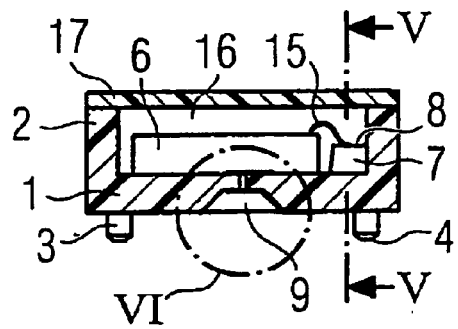
FIG. 4 shows a cross-section IV—IV through the connection carrier with component shown in FIG. 1.
Figure 5:
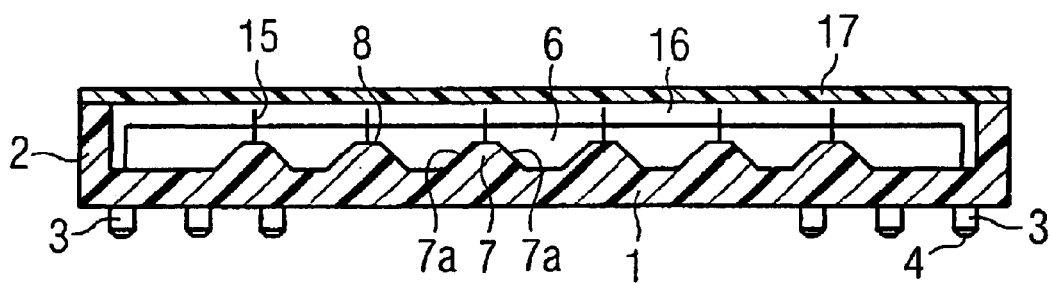
FIG. 5 shows a cross-section V—V from FIG. 4.

In its interior the base body 1 has a contact surface 5 for a component 6 (see FIGS. 4 and 5) which for example can be a surface wave filter or some other electronic component. In a side section not occupied by the component 6, cams 7 are provided in each case between the contact surface 5 for the component 5 and a side wall 2, the number of cams 7 corresponding to the number of device terminals. The cams 7 have at least one sloping falling side edge 7a. On their top side, the cams 7 are each provided with internal contacts 8 in the form of a metal coating. The metal coating extends in the form of a printed circuit track at least over one of the sloping side edges 7a to the bottom of the contact surface 5. For components having a larger number of terminals, it would naturally also be possible to provide further cams with internal contacts along the other longitudinal sides of the base body 1, in other words between the component 6 and the side walls 2.

Figure 6:
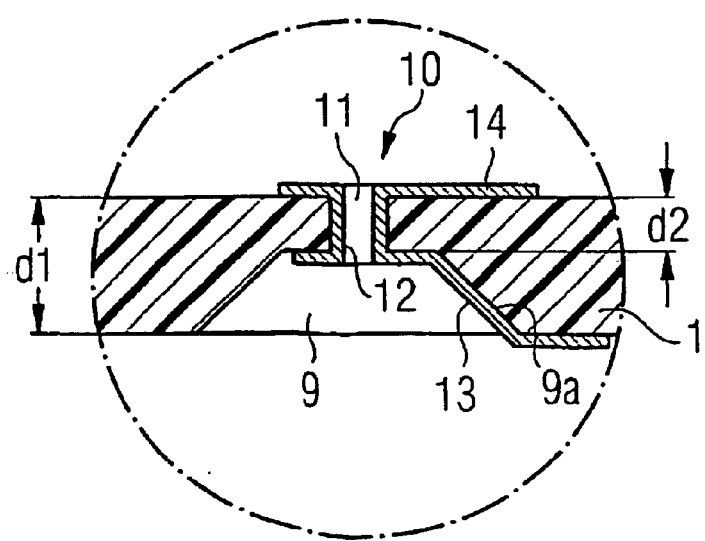
FIG. 6 shows an enlarged section from FIG. 4 (without component).

In its central area the base body 1 has a depression 9 on the underside which has sloping falling side walls 9a and thus forms a through-contact area 10 in the base of the base body 1 whose thickness d2 is considerably less than the thickness d1 of the actual base body 1 (see FIG. 6). In this through-contact area 10 a series of micro-boreholes 11 is provided whose inner walls are provided with a contact coating 12 which continues at the lower end in the form of a printed circuit track 13 over the sloping side wall 9a of the depression 9 and extends on the underside of the base body 1 to an associated protuberance 3 or to the external contact 4 carried by the protuberance. On the top side, this contact coating 12 continues in the form of a printed circuit track 14 to an associated internal contact 8 on a cam 7.

When the connection carrier according to an embodiment of the invention is being produced, firstly the base body is formed out by injection molding, including the side walls 2, the protuberances 4 and the depression 9 on the underside as well as the cams 7 on the top side. The requisite micro-boreholes 11 are then created by means of laser drilling in the area of the depression 9 or of the through-contact area 10. These micro-boreholes or vias have a diameter, for example, of 200 $\mu$m or preferably less. After this, the micro-boreholes are lined with a coating of contact metal. In addition, both the top side and also the underside of the base body 1 are coated with contact metal. After this, these metal layers are structured on the top side and on the underside of the base body using a laser in such a way that printed circuit tracks 13 and 14 insulated from one another and the internal contacts 8 on the cams 7 and also the external contacts 4 on the protuberances 3 are antipadded and insulated with respect to one another. This structuring can be carried out using a laser alone. However, a known method is also possible whereby the metal layer is initially covered with an etch resist, the printed circuit track structures are revealed by means of the laser by removing the etch resist and etching away non-required metal areas.

The component 6 is then placed on the contact surface 5 of the base body and its device terminals are connected by way of bond wires 15 to associated internal contacts 8. As can be seen from FIGS. 4 and 5, the side walls 2 of the base body are higher than the component 6 to be inserted. As a result, a predefined empty space 16 is kept free above the component, which is closed off with a cover 17. This is of significance, for example, for components such as surface wave filters and the like. The empty space 16 can, however, also be filled with a material with predefined characteristics, perhaps for a particular wave propagation. In this case, the closure could be obtained at the desired height above the component without an additional cover 17.

The depression 9 on the underside can likewise be filled and sealed off using a sealing compound. As already mentioned above, a corresponding depression could be provided on the top side of the base body 1 instead of or in addition to the depression 9 on the underside. It is naturally also possible to provide a plurality of depressions alongside one another and thereby to form a plurality of through-contact areas in the base body.

Figure 3:
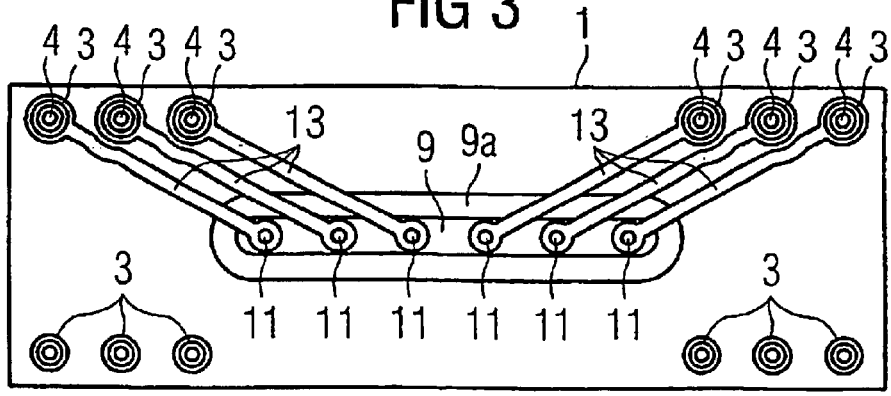
FIG. 3 shows a view of the underside of the connection carrier shown in FIG. 1.

As can also be seen in FIG. 3, in this embodiment the protuberances 3 are only provided with external contacts 4 in a row on one side of the base body. The protuberances 3 situated opposite thus serve simply as spacers in order to guarantee a symmetrical support base and, if required, facilities for securing the base body on a printed circuit board.

Different embodiments and variants are naturally also possible other than the example illustrated and described. When using flip-chip technology, the component can thus be mounted directly with its device terminals facing downwards onto the internal contacts such that these do not occupy any space alongside the component. It is also possible to create the micro-boreholes by using a suitable mechanical punching or drilling process instead of the described laser drilling process.

Exemplary embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A connection housing for at least one electronic component, comprising:

a tub-shaped base body formed from insulating material, including a top side surrounded by side walls and including a contact surface for the component, wherein at least on one side of the body, between its contact surface and a side wall of the base body, includes internal contacts providing the electrical connection with device terminals of the component, and on its underside includes protuberances formed from insulating material and at least partially coated with contact metal for forming external contacts, whereby the internal contacts are connected by way of printed circuit tracks to associated external contacts, wherein the base body includes micro-boreholes serving as through-contacts in the area of the contact surface for the component and wherein each micro-borehole on the top side is connected by way of a printed circuit track with an internal contact and is connected on the underside by way of a printed circuit track with an external contact.

2. A housing according to claim 1, wherein the internal contacts are formed by a metal coating by shaped cams on the base body, whereby the printed circuit tracks to the micro-boreholes are routed by way of roof-shaped sloping side walls on the cams.

3. A housing according to claim 2, wherein the base body includes a relatively reduced thickness in an area of the micro-boreholes as a result of a depression, whereby the printed circuit tracks are routed by way of ramp-shaped sloping side walls on the depression.

4. A housing according to claim 3, wherein the depression is provided in the underside of the base body.

5. A housing according to claim 4, wherein the depression is subsequently filled with sealing compound.

6. A housing according to claim 2, wherein the housing is equipped with a component, and wherein the component is arranged with its terminal side facing upward on the contact surface of the base body and wherein terminal elements of the component are connected by way of bond wires to the internal contacts of the housing.

7. A housing according to claim 6, wherein the side walls of the base body exceed the height of the component and wherein the space above the component is sealed by a flat cover connected to the upper edges of the side walls.

8. A housing according to claim 7, wherein an empty space is formed by the cover above the component.

9. A housing according to claim 2, further comprising protuberances, lying symmetrically opposite one another on the underside of the base body, whereby one section of the protuberances carries outer terminals and the other protuberances serve as spacers.

10. A housing according to claim 1, wherein the base body includes a relatively reduced thickness in an area of the micro-boreholes as a result of a depression, whereby the printed circuit tracks are routed by way of ramp-shaped sloping side walls on the depression.

11. A housing according to claim 10, wherein the depression is provided in the underside of the base body.

12. A housing according to claim 11, wherein the depression is subsequently filled with sealing compound.

13. A housing according to claim 10, wherein the depression is subsequently filled with sealing compound.

14. A housing according to claim 10, wherein the housing is equipped with a component, and wherein the component is arranged with its terminal side facing upward on the contact surface of the base body and wherein terminal elements of the component are connected by way of bond wires to the internal contacts of the housing.

15. A housing according to claim 14, wherein the side walls of the base body exceed the height of the component and wherein the space above the component is sealed by a flat cover connected to the upper edges of the side walls.

16. A housing according to claim 15, wherein an empty space is formed by the cover above the component.

17. A housing according to claim 10, further comprising protuberances, lying symmetrically opposite one another on the underside of the base body, whereby one section of the protuberances carries outer terminals and the other protuberances serve as spacers.

18. A housing according to claim 1, wherein the housing is equipped with a component, and wherein the component is arranged with its terminal side facing upward on the contact surface of the base body and wherein terminal elements of the component are connected by way of bond wires to the internal contacts of the housing.

19. A housing according to claim 18, wherein the component is a component which is sensitive to surface waves.

20. A housing according to claim 19, wherein an empty space is formed by the cover above the component.

21. A housing according to claim 18, wherein the side walls of the base body exceed the height of the component and wherein the space above the component is sealed by a flat cover connected to the upper edges of the side walls.

22. A housing according to claim 21, wherein the space above the component is filled with a material with predefined wave propagation.

23. A housing according to claim 21, wherein an empty space is formed by the cover above the component.

24. A housing according to claim 18, wherein an empty space is formed by the cover above the component.

25. A housing according to claim 1, further comprising protuberances, lying symmetrically opposite one another on the underside of the base body, whereby one section of the protuberances carries outer terminals and the other protuberances serve as spacers.

* * * * *